US007810956B2

(12) United States Patent
Bierhuizen et al.

(10) Patent No.: US 7,810,956 B2
(45) Date of Patent: Oct. 12, 2010

(54) LIGHT SOURCE INCLUDING REFLECTIVE WAVELENGTH-CONVERTING LAYER

(75) Inventors: Serge J. Bierhuizen, Santa Rosa, CA (US); Gerard Harbers, Sunnyvale, CA (US)

(73) Assignees: Koninklijke Philips Electronics N.V., Eindhoven (NL); Philips Lumileds Lighting Company, San Jose, CA (US)

( * ) Notice: Subject to any disclaimer, the term of this patent is extended or adjusted under 35 U.S.C. 154(b) by 96 days.

(21) Appl. No.: 11/844,176

(22) Filed: Aug. 23, 2007

(65) Prior Publication Data

US 2009/0052158 A1 Feb. 26, 2009

(51) Int. Cl.
*F21V 9/00* (2006.01)
*F21V 29/00* (2006.01)

(52) U.S. Cl. .................. 362/294; 362/293; 362/296.01; 362/255; 362/311.02; 313/111; 313/112; 313/512

(58) Field of Classification Search ................. 362/231, 362/293, 297, 304, 346, 296, 307, 308, 310, 362/311, 255, 296.01, 294, 311.02; 313/111, 313/112, 512

See application file for complete search history.

(56) References Cited

U.S. PATENT DOCUMENTS 6,351,069 B1 2/2002 Lowery et al.
6,357,889 B1 3/2002 Duggal et al.
6,576,488 B2 6/2003 Collins, III et al.
6,630,691 B1 10/2003 Mueller-Mach et al.
6,650,044 B1 11/2003 Lowery
6,653,765 B1 * 11/2003 Levinson et al. ............ 313/112
6,696,703 B2 2/2004 Mueller-Mach et al.
6,886,967 B2 * 5/2005 Quang ........................ 362/455
7,196,354 B1 3/2007 Erchak
7,458,703 B2 * 12/2008 Han et al. ................... 362/267
2003/0201451 A1 10/2003 Suehiro et al.
2004/0145895 A1 * 7/2004 Ouderkirk et al. ........... 362/260
2006/0034084 A1 * 2/2006 Matsuura et al. ............ 362/293
2006/0097385 A1 * 5/2006 Negley ....................... 257/722
2008/0030993 A1 * 2/2008 Narendran et al. .......... 362/296
2008/0094829 A1 * 4/2008 Narendran et al. .......... 362/231
2009/0273918 A1 * 11/2009 Falicoff et al. ................ 362/84

* cited by examiner

*Primary Examiner*—Jacob Y Choi

(57) ABSTRACT

A light source configured to emit first light is combined with a wavelength-converting layer. The wavelength-converting layer is disposed in a path of first light, is spaced apart from the light source, and includes at least one wavelength-converting material such as a phosphor configured to absorb first light and emit second light. The wavelength-converting layer is disposed between a reflective layer and the light source. In some embodiments, the wavelength-converting layer is a thick layer.

20 Claims, 3 Drawing Sheets

LIGHT SOURCE INCLUDING REFLECTIVE WAVELENGTH-CONVERTING LAYER

BACKGROUND

1. Field of Invention

This invention relates to wavelength-converted light sources, such as wavelength-converted semiconductor light emitting devices.

2. Description of Related Art

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

Since the light emitted by current commercially available III-nitride devices is generally on the shorter wavelength end of the visible spectrum, the light generated by III-nitride devices can be readily converted to produce light having a longer wavelength. It is well known in the art that light having a first peak wavelength (the "primary light") can be converted into light having one or more longer peak wavelengths (the "secondary light") using a process known as luminescence/fluorescence. The fluorescent process involves absorbing the primary light by a wavelength-converting material such as a phosphor and exciting the luminescent centers of the phosphor material, which emit the secondary light. The peak wavelength of the secondary light will depend on the phosphor material. The type of phosphor material can be chosen to yield secondary light having a particular peak wavelength.

FIG. 1 illustrates a prior art phosphor-converted LED 10 described in U.S. Pat. No. 6,351,069. The LED 10 includes a III-nitride die 12 that generates blue primary light when activated. The III-nitride die 12 is positioned on a reflector cup lead frame 14 and is electrically coupled to leads 16 and 18. The leads 16 and 18 conduct electrical power to the III-nitride die 12. The III-nitride die 12 is covered by a layer 20, often a transparent resin, which includes wavelength-converting material 22. The type of wavelength-converting material utilized to form the layer 20 can vary, depending upon the desired spectral distribution of the secondary light that will be generated by the fluorescent material 22. The III-nitride die 12 and the fluorescent layer 20 are encapsulated by a lens 24. The lens 24 is typically made of a transparent epoxy or silicone.

In operation, electrical power is supplied to the III-nitride die 12 to activate the die. When activated, die 12 emits the primary light away from the top surface of the die. A portion of the emitted primary light is absorbed by the wavelength-converting material 22 in the layer 20. The wavelength-converting material 22 then emits secondary light, i.e., the converted light having a longer peak wavelength, in response to absorption of the primary light. The remaining unabsorbed portion of the emitted primary light is transmitted through the wavelength-converting layer, along with the secondary light. The lens 24 directs the unabsorbed primary light and the secondary light in a general direction indicated by arrow 26 as output light. Thus, the output light is a composite light that is composed of the primary light emitted from die 12 and the secondary light emitted from the wavelength-converting layer 20. The wavelength-converting material may also be configured such that very little or none of the primary light escapes the device, as in the case of a die that emits UV primary light combined with one or more wavelength-converting materials that emit visible secondary light.

Alternative configurations of phosphor-converted LEDs include LED devices grown on single crystal luminescent substrates as described in U.S. Pat. No. 6,630,691, thin film phosphor layers formed on LEDs as described in U.S. Pat. No. 6,696,703, and conformal layers deposited on LEDs by electrophoretic deposition as described in U.S. Pat. No. 6,576,488 or by stenciling as described in U.S. Pat. No. 6,650,044.

The above described devices, where the phosphor layer is formed on a surface of the light emitting device, may have several disadvantages. It is difficult to achieve color uniformity when a phosphor is applied directly to a surface of an LED, due to variations in the path of light through the phosphor and in the thickness of the phosphor layer. Also, heat from the LED can undesirably shift the color point of the phosphor or degrade the phosphor.

SUMMARY

In accordance with embodiments of the invention, a light source configured to emit first light is combined with a wavelength-converting layer. The wavelength-converting layer is disposed in a path of first light, is spaced apart from the light source, and includes at least one wavelength-converting material, such as a phosphor, configured to absorb first light and emit second light. The wavelength-converting layer is disposed between a reflective layer and the light source. In some embodiments, the wavelength-converting layer is a thick layer.

The color point of mixed first and second light exiting the system can be easily controlled since the wavelength-converting layer is thick, spaced apart from the light source, and mixed by the reflective layer. Since the wavelength-converting layer is spaced apart from the light source, the wavelength-converting layer is not heated by the light source and can be efficiently cooled by a heat sink, eliminating or reducing loss of efficiency and/or shift in color point caused by heating of the wavelength-converting material. The wavelength-converting layer is also inexpensive and reliable to produce.

DETAILED DESCRIPTION

Figure 1:
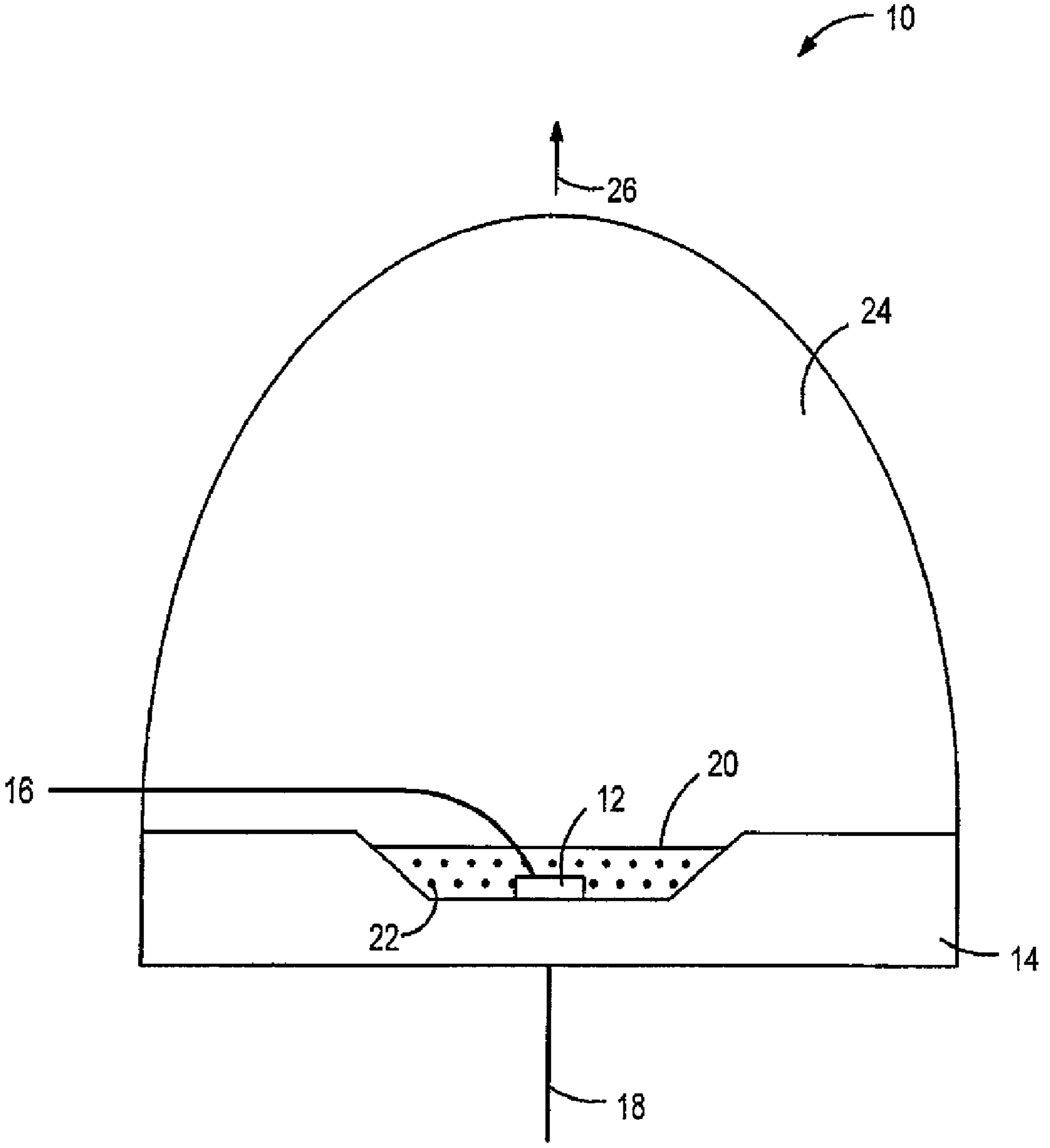
FIG. 1 is a cross sectional view of a prior art phosphor-converted LED.
Figure 2:
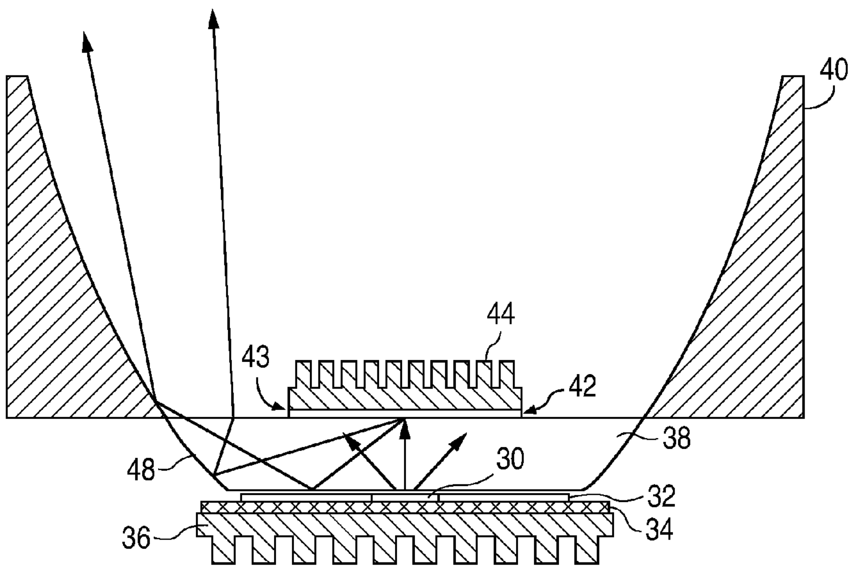
FIG. 2 is a cross sectional view of an LED spot lamp including a reflective wavelength converting layer, according to embodiments of the invention.

In accordance with embodiments of the invention, a thick, reflective wavelength-converting layer such as a phosphor is spaced apart from a semiconductor light emitting device such as an LED. FIG. 2 is a cross sectional view of an LED-based spot lamp according to an embodiment of the invention. A light source 30 is mounted on mount 34 and optional heat sink 36. Heat sink 36 may be finned as illustrated in FIG. 2. Light emitted from light source 30 and reflected off a mirror 32 surrounding light source 30 is extracted into an optical plate 38. A wavelength-converting layer 42 is spaced apart from light source 30 and positioned to receive light from light source 30. An optional heat sink 44 may cool wavelength converting layer 42. A collection optic 40 collimates the light.

Light source 30, may be, for example, any suitable light source that can produce short wavelength light, for example blue or ultraviolet light, such as an LED or other semiconductor device, an array of LEDs, a xenon lamp, or mercury lamp. In the case of a semiconductor device used as light source 30, the device can be configured such that a majority of light is emitted from the side of the device, or can be configured with an emission pattern that is Lambertian (a 90° cone of light from a normal to the surface of the light source), or confined to smaller cone by, for example, a photonic crystal such as a lattice structure formed in an extraction surface of the device.

Light source 30 may be mounted on an optional mount 34, and connected to an optional heat sink 36. In some embodiments, in a light source consisting of an array of LEDs, LEDs that emit light at different wavelengths are used. Each wavelength may be selected to tune the white point of mixed LED and wavelength-converted light emitted from the system, or to be matched to a particular phosphor in wavelength-converting layer 42, for improved efficiency.

Light is extracted from light source 30 into optical plate 38. Optical plate 38 may be shaped to direct light toward collection optic 40. For example, sides 48 may be slanted or curved such that total internal reflection directs light into collection optic 40. Optical plate 38 may be, for example, a transparent material such as glass or plastic. Sides 48 may be coated with an optional reflective material. Optical plate 38 may have a thickness on the order of a length of a side of light source 30. If light source 30 is a single LED or an array of LEDs, the length of a side of light source 30 may be, for example, between 0.5 and 5 mm, between 0.5 and 1.5 mm, or between 0.5 and 2.5 mm. Light source 30 may be square, rectangular, or any other suitable shape. As illustrated in FIG. 2, the area of the bottom surface of optical plate 38 may be larger than the area of light source 30; for example, between 2 and 100 times larger or between 5 and 15 times larger. Wavelength converting layer 42 is spaced apart from light source 30 by at least the thickness of optical plate 38.

Light source 30 may be spaced apart from optical plate 38, such that due to refraction at the interface with a glass optical plate 38, light from light source 30 is confined in a beam with an angle from normal of about 42°, depending on the refractive index of optical plate 38. Wavelength-converting layer 42 is then configured such that no light from light source 30 bypasses wavelength-converting layer 42. Alternatively, light source 30 may be in optical contact with plate 38 in which case the light within optical plate 38 from light source 30 will be spread out ±90°. Some light may bypass the wavelength-converting layer and be directed toward collection optic 40.

A mirror 32 is disposed adjacent or beneath light source 30. In some embodiments, roughly 30% of light emitted by wavelength-converting layer 42 is emitted back toward light source 30. Mirror 32 reflects at least some of this light back into optical plate 38. Mirror 32 may be, for example, a highly reflective coating on the bottom of optical plate 38, or a separate mirror, spaced apart from optical plate 38. Examples of suitable coatings and materials include silver, aluminum, dichroic coatings, aluminum combined with a dichroic coating to enhance the reflectivity of the aluminum, and materials such as oxides of titanium and oxides of aluminum formed by a sol gel process.

The collection optic 40 shown in FIG. 2 is a hollow reflector. The shape may be parabolic, compound parabolic, elliptical, or formed from multiple flat facets or segments. A segmented optic may improve color uniformity.

Figure 3:
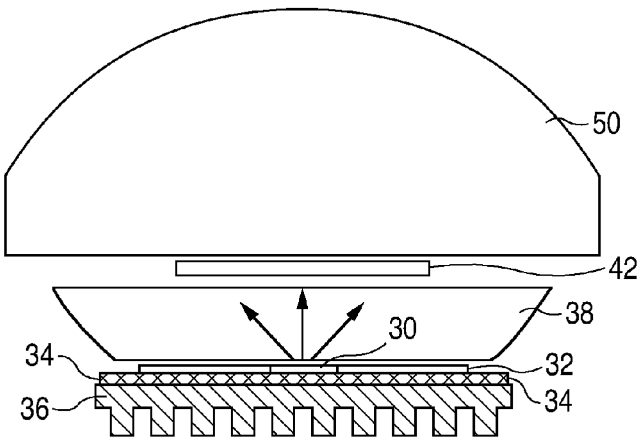
FIG. 3 is a cross sectional view of an LED spot lamp including a reflective wavelength converting layer and a solid optic, according to embodiments of the invention.

FIG. 3 illustrates a device with a solid optic 50. Optic 50 may be, for example, glass or plastic, and may be attached to the top of wavelength converting layer 42 for example by an adhesive. Alternatively, optic 50 may be overmolded onto wavelength converting layer 42. To overmold optic 50, a mold with an indentation corresponding to the desired shape of lens 50 is aligned with a device. The mold is generally metal. An optional thin non-stick film, having the general shape of the mold, may be placed over the mold. The non-stick film is a material that prevents the molding material from sticking to the metal mold. The indention in the mold is filled with a heat-curable liquid lens material. The lens material may be any suitable optically transparent material such as silicone or epoxy. A silicone with a sufficiently high index of refraction (for example, at least 1.76) may be selected to improve the light extraction from a III-nitride or other device, in addition to acting as a lens. A vacuum seal may be created between the periphery of the device and the mold, then the two pieces are pressed against each other so that the device is inserted into the liquid lens material. The lens material may be under compression. The structure may then be heated to a temperature and for a time suitable to harden the lens material, for example at least 150° C. for at least 30 minutes. After curing, the device is separated from the mold. The film releases the hardened lens 50 from the mold. The film is then removed.

Wavelength-converting layer 42 may include one or more phosphors configured to absorb light emitted by light source 30 and to emit light of a longer wavelength. For example, for a light source 30 that emits blue light, wavelength-converting layer 42 may include a single phosphor that emits yellow light, or multiple phosphors that emit red and green light. For a light source that emits UV light, wavelength-converting layer 42 may include phosphors that emit blue and yellow light, or phosphors that emit blue, green, and red light. Additional phosphors emitting additional colors may be added, and/or the phosphors emitting the colors described above may be removed, in order to control the color point of mixed light exiting the system.

Wavelength-converting layer 42 is a thick layer, configured such that the effective optical thickness is determined by the optical scattering processes in the particular wavelength-converting materials, usually phosphors, used. Wavelength-converting layer 42 may be, for example, between 5 and 500 microns thick, and is often between 100 and 250 microns thick. Wavelength-converting layer 42 is thick enough that a consistent color point of the mixed light escaping collection optic 40, 50 is achieved.

Wavelength-converting layer 42 may be formed by, for example, screen printing one or more phosphors on the bottom side of heat sink 44, or on the top side of optical plate 38. In some embodiments, wavelength-converting layer 42 has a lateral extent large enough to absorb the entire cone of light extracted from light source 30. In some embodiments, the lateral extent of wavelength-converting layer 42 is selected to permit some light from light source 30 to bypass wavelength-converting layer 42 unconverted. Wavelength-converting layer 42 may be in optical communication with optical plate 38, to achieve an isotropic radiation pattern in optical plate 38.

A wavelength-converting layer 42 formed on heat sink 44 may be held in position for example by an adhesive such as silicone disposed between wavelength-converting layer 42 and optical plate 38. In the case of a wavelength-converting layer 42 formed on optical plate 38, heat sink 44 may be attached by an adhesive 43 such as silicone. The adhesive layer may be thin, for example thinner than wavelength-converting layer 42. Heat sink 44 may be any suitable material, such as copper or aluminum, and may be coated with a reflective material or dielectric stack. Heat sink 44 may be finned to increase the surface area, as illustrated in FIG. 2. The bottom side of heat sink 44 may be configured to be reflective of light emitted by light source 30 and wavelength-converting layer 42.

In some embodiments, the reflective region over wavelength-converting layer 42 (for example, reflective heat sink 44 or a reflective coating on heat sink 44) has a lateral extent larger than wavelength-converting layer 42, though not as large as the top surface of optical plate 38. Such a configuration may be used, for example, in embodiments where some light from light source 30 bypasses wavelength-converting layer. The reflective region extending beyond wavelength-converting layer 42 reflects at least some of the unconverted light from light source 30. In the example of a reflective heat sink 44, the bottom surface of heat sink 44 may be flat, such that there is a gap between optical plate 38 and the edges of heat sink 44 extending beyond wavelength-converting layer 42, or conformal to wavelength-converting layer 42, such that there is no gap between the top surface of optical plate 38 and the edges of heat sink 44 extending beyond wavelength-converting layer 42.

Figure 4:
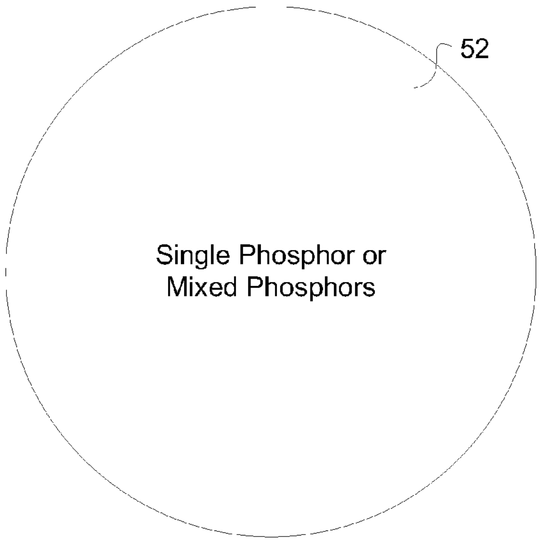
FIG. 4 illustrates a wavelength-converting layer with a single phosphor or multiple, mixed phosphors.
Figure 5:
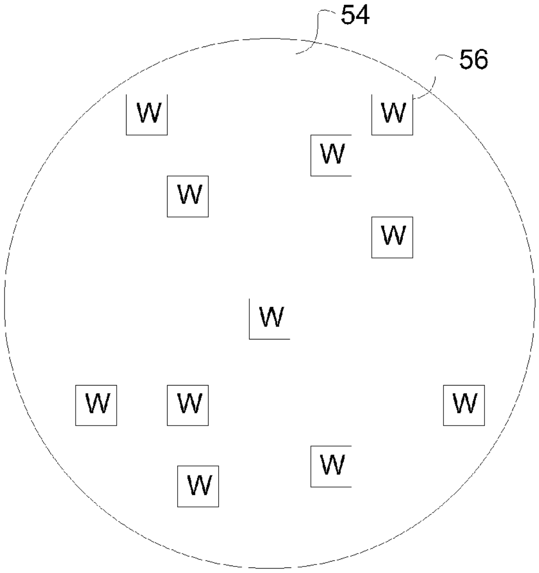
FIG. 5 illustrates a wavelength-converting layer with non-wavelength-converting areas.
Figure 6:
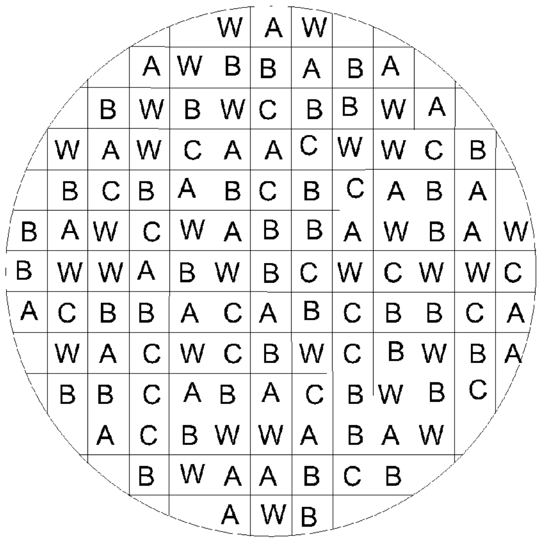
FIG. 6 illustrates a wavelength-converting layer with non-wavelength-converting areas and multiple phosphors deposited in discrete areas.

FIGS. 4, 5, and 6 illustrates three examples of wavelength-converting layers. In the layer illustrated in FIG. 4, a single phosphor or multiple phosphors mixed together are screen-printed in a single, substantially homogeneous layer 52. In the layer illustrated in FIG. 5, several non-wavelength-converting areas 56 are surrounded by a single or multiple phosphors mixed together formed in a single, substantially homogeneous layer 54. Non-wavelength-converting areas 56 may be, for example, an absence of wavelength-converting material, the host matrix of a wavelength converting material without activating dopant (for example, $Y_3Al_5O_{12}$ crystal without Ce dopant) or a non-wavelength-converting transparent, reflective, or scattering material such as an oxide of aluminum or an oxide of titanium. The size and shape of non-wavelength-converting areas 56 may be determined by the material, manufacturing process used, and by the required amount of mixing of wavelength-converted light with unconverted light. For example, non-wavelength-converting areas may be between 50 microns and 1 millimeter in length, and are often between 100 microns and 500 microns in length.

In the layer illustrated in FIG. 6, multiple wavelength converting materials A, B, and C are formed in discrete areas. Wavelength-converting materials A, B, and C may be, for example, different phosphors, and may emit different colors of light, though they need not. Each wavelength-converting material may occupy the same fraction of the area of the entire wavelength-converting layer, or some wavelength-converting materials may occupy more area than others, which may result in more emission from the larger-area wavelength-converting materials. Areas of non-wavelength-converting material W may be optionally included. For example, in a system with a blue light source and red- and green-emitting phosphors, if a desired white point requires more green light than red, the green-emitting phosphor areas may occupy a larger fraction of the total area of the wavelength-converting layer than the red-emitting phosphor. The fractional area of non-wavelength-converting material may permit a desired amount of blue light from light source 30 to exit the system unconverted by wavelength-converting layer 42. Each area of wavelength-converting or non-wavelength-converting material may be between 50 microns and 1 millimeter in length, and is often between 100 microns and 500 microns in length. Each area may be the same size and shape, though they need not be. The area size is selected to be large enough to be readily manufactured, and small enough to provide sufficient mixing of light of different colors.

Wavelength-converting layers may be formed by, for example, screen printing, spin coating, spray coating, dip coating, blade coating, or casting.

Examples of suitable yellow- or green-emitting phosphors include $(Lu_{1-x-y-a-b}Y_xGd_y)_3(Al_{1-z}Ga_z)_5O_{12}:Ce_a^{3+}Pr_b^{3+}$ wherein $0<x<1$, $0<y<1$, $0<z\leqq 0.1$, $0<a\leqq 0.2$ and $0<b\leqq 0.1$ including, for example, $Lu_3Al_5O_{12}:Ce^{3+}$ and $Y_3Al_5O_{12}:Ce^{3+}$; $(Sr_{1-a-b}Ca_bBa_c)Si_xN_yO_z:Eu_a^{2+}$ (a=0.002–0.2, b=0.0–0.25, c=0.0–0.25, x=1.5–2.5, y=1.5–2.5, z=1.5–2.5) including, for example, $SrSi_2N_2O_2:Eu^{2+}$; $(Sr_{1-u-v-x}Mg_uCa_vBa_x)(Ga_{2-y-z}Al_yIn_zS_4):Eu^{2+}$ including, for example, $SrGa_2S_4:Eu^{2+}$; and $Sr_{1-x}Ba_xSiO_4:Eu^{2+}$.

Examples of suitable red-emitting phosphors include $(Ca_{1-x}Sr_x)S:Eu^{2+}$ wherein $0<x\leqq 1$ including, for example, $CaS:Eu^{2+}$ and $SrS:Eu^{2+}$; $(Sr_{1-x-y}Ba_xCa_y)_{2-z}Si_{5-a}Al_aN_{8-a}O_a:EU_z^{2+}$ wherein $0\leqq a<5$, $0<x\leqq 1$, $0\leqq y\leqq 1$, and $0<z\leqq 1$ including, for example, $Sr_2Si_5N_8:Eu^{2+}$; and eCAS, which is $Ca_{0.99}AlSiN_3:Eu_{0.01}$.

Examples of suitable blue-emitting phosphors include, for example, $MgSrSiO_4$.

In some embodiments, wavelength-converting layers may include luminescent ceramics. Synthesis of eCAS, BSSNE, and SSONE luminescent ceramics is described below. These phosphors may be used in powder form by skipping the final synthesis steps, where the powder phosphor is pressed into a luminescent ceramic.

In one embodiment, the luminescent ceramic is eCAS, which is $Ca_{0.99}AlSiN_3:Eu_{0.01}$ synthesized from 5.436 g $Ca_3N_2$ (>98% purity), 4.099 g AlN (99%), 4.732 g $Si_3N_4$ (>98% purity) and 0.176 g $Eu_2O_3$ (99.99% purity). The powders are mixed by planetary ball milling, and fired for 4 hours at 1500° C. in $H_2/N_2$ (5/95%) atmosphere. The granulated powder is uniaxially pressed into pellets at 5 kN and cold isostatically pressed (CIP) at 3200 bar. The pellets are sintered at 1600° C. in $H_2/N_2$ (5/95%) atmosphere for 4 hours. The resulting pellets display a closed porosity and are subsequently hot isostatically pressed at 2000 bar and 1700° C. to obtain dense ceramics with >98% of the theoretical density.

In one embodiment, the luminescent ceramic is BSSNE, which is $Ba_{2-x-z}M_xSi_{5-y}Al_yN_{8-y}O_y:Eu_z$ (M=Sr, Ca; $0\leqq x\leqq 1$, $0\leqq y\leqq 4$, $0.0005\leqq z\leqq 0.05$). The flow diagram depicted in FIG. 2 shows schematically how $Ba_{2-x-z}M_xSi_{5-y}Al_yN_{8-y}O_y$:$Eu_z$ (M=Sr, Ca; 0≦x≦1, 0≦y≦4, 0.0005≦z≦0.05) ceramics are prepared. Firstly $Ba_{2-x-z}M_xSi_{5-y}Al_yN_{8-y}O_y$:$Eu_z$ (M=Sr, Ca; 0≦x≦1, 0≦y≦4, 0.0005≦z≦0.05) is prepared in powder form. Several methods can be applied for this purpose such as carbothermal reduction, which includes mixing 60 g $BaCO_3$, 11.221 g $SrCO_3$ and 1.672 g $Eu_2O_3$ (all 99.99% purity) by planetary ball milling using 2-propanol as dispersing agent. After drying, the mixture is fired in forming gas atmosphere at 1000° C. for 4 hours and 10 g of the thus obtained $Ba_{0.8}Sr_{0.2}O$:Eu (2%) are mixed with 5.846 g $Si_3N_4$ (>98% purity), 0.056 g AlN (99% purity) and 1.060 g graphite (microcrystal grade). The powders are thoroughly mixed by 20 min. planetary ball milling and fired for 4 hours at 1450° C. in forming gas atmosphere (block 188) to obtain a precursor powder of $Ba_{2-x-z}M_xSi_{5-y}Al_yN_{8-y}O_y$:$Eu_z$ (M=Sr, Ca; 0≦x≦1, 0≦y≦4, 0.0005≦z≦0.05). The powder is washed with HCl and milled again. The obtained precursor powder is then hot pressed at 1550° C. and 80 MPa yielding dense ceramic bodies. These are sliced, polished and diced to obtain the desired shape and optical surface properties. If necessary annealing at 1300° C. in nitrogen can be applied to remove defects.

In one embodiment, the luminescent ceramic is SSONE, which is manufactured by mixing 80.36 g $SrCO_3$ (99.99% purity), 20.0 g $SiN_{4/3}$ (>98% purity) and 2.28 g $Eu_2O_3$ (99.99% purity) and firing at 1200° C. for 4 hour in a $N_2/H_2$ (93/7) atmosphere. After washing, the precursor powder is uniaxially pressed at 10 kN and subsequently cold isostatic pressed at 3200 bar. Sintering is typically done at temperatures between 1550° C. and 1580° C. under $H_2/N_2$ (5/95) or pure nitrogen atmosphere.

A device according to embodiments of the invention may have several advantages over conventional phosphor-converted light emitting devices. First, since the wavelength-converting layer is thick and spaced apart from the light source, the thickness of the wavelength-converting layer need not be controlled as precisely as, for example, a phosphor layer deposited directly on a surface of an LED. The color point of light exiting the system can therefore be easily controlled. Second, since the wavelength-converting layer is spaced apart from the light source, the wavelength-converting layer is not heated by the light source and can be efficiently cooled by a heat sink; therefore, loss of efficiency and/or shift in color point caused by heating can be reduced or eliminated. Third, deposition techniques such as screen printing on a heat sink or optical plate may be less expensive and more reliable than some techniques for depositing a phosphor directly on a surface of a light emitting device, such as electrophoretic deposition or stenciling.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A structure comprising:

a light source configured to emit a first light along a forward optical axis;

a wavelength-converting layer, wherein the wavelength-converting layer is disposed in a path of the first light, is spaced apart from the light source, and comprises a first wavelength-converting material configured to absorb the first light and emit a second light; and a reflective layer configured to be reflective of the first light and the second light, wherein the wavelength-converting layer is disposed between the reflective layer and the light source, and wherein the reflective layer is a surface of a heat sink having a plurality of fins.

2. The structure of claim 1 wherein the light source comprises at least one semiconductor light emitting diode.

3. The structure of claim 1 wherein the wavelength-converting layer further comprises a non-wavelength converting material.

4. The structure of claim 1 wherein the wavelength-converting layer further comprises a second wavelength-converting material.

5. The structure of claim 4 wherein the first wavelength-converting material is disposed in a first portion of the wavelength-converting layer and the second wavelength-converting material is disposed in a second portion of the wavelength-converting layer.

6. The structure of claim 4 wherein the first and second wavelength-converting materials are phosphors.

7. The structure of claim 1 wherein the wavelength-converting layer has a thickness between 5 and 500 microns.

8. The structure of claim 1 wherein the reflective layer is in direct contact with the wavelength-converting layer.

9. The structure of claim 1 further comprising an adhesive layer disposed between the reflective layer and the wavelength-converting layer.

10. The structure of claim 1 wherein the reflective layer has a lateral extent approximately equal to a lateral extent of the wavelength-converting layer.

11. The structure of claim 1 wherein the reflective layer has a lateral extent larger than a lateral extent of the wavelength-converting layer.

12. The structure of claim 1 further comprising a transparent member disposed between the light source and the wavelength-converting layer.

13. The structure of claim 12 further comprising a mirror proximate a bottom surface of the transparent member.

14. The structure of claim 13 wherein the mirror comprises a reflective coating disposed on a portion of a bottom surface of the transparent member.

15. The structure of claim 1 wherein the wavelength-converting layer is positioned in a collimating optic comprising reflective sidewalls.

16. The structure of claim 1 further comprising a lens disposed over the reflective layer.

17. The structure of claim 1 wherein the wavelength converting layer and the light source are spaced at least 0.5 mm apart.

18. The structure of claim 1 wherein the reflective layer is one of a metal, a reflective coating, and a dielectric stack.

19. The structure of claim 1, wherein the wavelength converting layer and the light source are spaced by a distance of a length of a side of the light source.

20. The structure of claim 1, wherein the wavelength converting layer has a thickness between 100 and 250 microns.

* * * * *